(12) United States Patent
Gansinger et al.

(10) Patent No.: US 9,531,326 B2
(45) Date of Patent: Dec. 27, 2016

(54) LIMITING AMPLIFIERS

(71) Applicant: Infineon Technologies AG, Neubiberg (DE)

(72) Inventors: Stefan Gansinger, Graz (AT); Ralf-Rainer Schledz, St. Margarethen (AT); Walter Schuchter, Graz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/616,797

(22) Filed: Feb. 9, 2015

(65) Prior Publication Data
US 2015/0236653 A1   Aug. 20, 2015

(30) Foreign Application Priority Data

Feb. 14, 2014   (DE) .................. 10 2014 101 911

(51) Int. Cl.
| | |
|---|---|
| H03G 3/30 | (2006.01) |
| H03F 1/02 | (2006.01) |
| H03F 1/30 | (2006.01) |
| H03F 3/21 | (2006.01) |
| H03F 3/45 | (2006.01) |
| H03G 1/00 | (2006.01) |
| H03G 7/00 | (2006.01) |

(52) U.S. Cl.
CPC .............. H03F 1/0216 (2013.01); H03F 1/30 (2013.01); *H03F 3/211* (2013.01); *H03F 3/45183* (2013.01); *H03F 3/45475* (2013.01); *H03G 1/0029* (2013.01); *H03G 3/30* (2013.01); *H03G 7/004* (2013.01); *H03F 2200/153* (2013.01); *H03F 2200/405* (2013.01); *H03F 2200/447* (2013.01); *H03F 2200/453* (2013.01); *H03F 2203/45138* (2013.01); *H03F 2203/45688* (2013.01)

(58) Field of Classification Search
CPC ...................................... H03F 3/45; H03F 3/68
USPC .................................. 330/69, 133, 310, 311
See application file for complete search history.

(56) References Cited

U.S. PATENT DOCUMENTS

| | | | |
|---|---|---|---|
| 7,245,181 B2 | 7/2007 | Sanduleanu et al. | |
| 7,394,318 B2 * | 7/2008 | Mason | H03G 3/30 330/133 |

* cited by examiner

*Primary Examiner* — Steven J Mottola
(74) *Attorney, Agent, or Firm* — Eschweiler & Associates, LLC (57) ABSTRACT

A limiting amplifier includes a multiplicity of cascaded amplifier stages for amplifying an input signal for the amplifier. A further amplifier stage is supplied with a reference signal. On the basis of an output signal from the further amplifier stage, a control signal for adjusting a gain of at least one of the cascaded amplifier stages is produced.

16 Claims, 6 Drawing Sheets

LIMITING AMPLIFIERS

FIELD

The present application relates to limiting amplifiers and to methods for operating a limiting amplifier.

BACKGROUND

In the field of receiver apparatuses for communication appliances, for example, it is known practice to use limiting amplifiers. A limiting amplifier is typically implemented by means of a plurality of cascaded amplifier stages. In this way, it is possible to achieve a limiting amplifier characteristic in which smaller input signals are subject to higher gain than larger input signals. Typically, the amplifier characteristic of a limiting amplifier is essentially logarithmic. An example of a limiting amplifier with cascaded amplifier stages is described in "A 2-V 10.7-MHz CMOS Limiting Amplifier/RSSI", Po-Chiun Huang et al., IEEE Journal of Solid-State Circuits, vol. 35, No. 10, October 2000.

Realization of the limiting amplifier characteristic requires the various amplifier stages each to provide a well-defined gain. However, this is made more difficult by the fact that the amplifier circuits used typically react sensitively to variations in process conditions, supply voltage and temperature conditions and the gain actually provided by an amplifier stage can therefore differ from a desired setpoint value.

In order to provide a particular gain for an amplifier stage, there are various possibilities that exist in principle. One is to implement various ratios for transconductances by CMOS transistors (CMOS: "Complementary Metal Oxide Semiconductor"). A further possibility is to use a transconductance amplifier in connection with a particular load resistor.

In the case of the first option cited, the gain is determined by ratios of transconductances in the transistors used in the amplifier circuit. These ratios can be realized by using transistors having different channel widths. A disadvantage of this option is that the transistors need to be operated in the range of strong inversion, since otherwise their transconductance does not scale with the channel width, as required. In addition, a minimal current is required in order to operate a transistor in the range of strong inversion, which means that achieving low power draw is made more difficult.

In the case of the second option cited, the gain is defined by the product of the transconductance provided by the transconductance amplifier and the resistance value of the load resistor. It is therefore possible to stipulate the gain by means of an appropriate selection of the resistance value of the load resistor. Since operation in the range of strong inversion is not required in this case, achieving low power draw is simplified. However, since both the transconductance and the resistance value of the load resistor are typically dependent on temperature, supply voltage and process conditions, the gain is also subject to corresponding variations, which means that observing a well-defined gain value is made more difficult.

SUMMARY

It is therefore an object of the present disclosure to provide technologies that allow efficient implementation of a limiting amplifier.

According to one example embodiment of the disclosure, a limiting amplifier is therefore provided. The amplifier comprises a multiplicity of cascaded amplifier stages for amplifying an input signal for the amplifier. In addition, the amplifier comprises a further amplifier stage, which is modeled on one of the cascaded amplifier stages. The further amplifier stage is supplied with a reference signal. In addition, the amplifier comprises a control circuit that is designed to take an output signal from the further amplifier stage as a basis for producing a control signal for adjusting a gain of at least one of the cascaded amplifier stages.

According to a further example embodiment, a method is provided that can be used to control the operation of a limiting amplifier. According to the method, an input signal is supplied to a multiplicity of cascaded amplifier stages of a limiting amplifier. In addition, a reference signal is supplied to a further amplifier stage, which is modeled on one of the cascaded amplifier stages. A control signal is produced on the basis of an output signal from the further amplifier stage. A gain of at least one of the cascaded amplifier stages is adjusted using the control signal.

BRIEF DESCRIPTION OF THE DRAWINGS

Further details of the cited example embodiments and further example embodiments are described below with reference to the appended drawings.

DETAILED DESCRIPTION

Example embodiments of the present disclosure are explained in more detail below with reference to the appended drawings. In this context, it goes without saying that the example embodiments shown are merely intended to be used to illustrate implementation options for the disclosure and are not intended to be understood as a limitation of the latter. In particular, features from different example embodiments can be combined with one another. In addition, a description of an example embodiment having a multiplicity of features is not intended to be interpreted to mean that all of these features are necessary for implementing the disclosure. By way of example, other example embodiments could have fewer features and/or alternative features.

Example embodiments presented below relate to a limiting amplifier and to a method for operating a limiting amplifier. By way of example, the limiting amplifier can be used in a receiver apparatus for a communication appliance, e.g. in a radio receiver.

The limiting amplifier has a multiplicity of amplifier stages that are arranged in cascaded fashion. In the case of at least one of the cascaded amplifier stages, typically in the case of all cascaded amplifier stages, a gain provided by the respective amplifier stage can be adjusted using a control signal. The cascaded amplifier stages are used to amplify an input signal from the amplifier. In order to produce the control signal, a further amplifier stage is provided, which is supplied not with the input signal for the amplifier but rather with a reference signal. The further amplifier stage is modeled on one of the cascaded amplifier stages. The further amplifier stage is therefore also referred to as a replica amplifier stage below. However, it goes without saying in this context that the replica amplifier stage does not necessarily need to be an exact replica of one of the cascaded amplifier stages. Instead, the replica amplifier stage is typically implemented by identical circuit structures to the modeled cascaded amplifier stage, but may differ therefrom in terms of the dimensioning of its circuit components. In addition, the cascaded amplifier stages are also typically implemented by identical circuit structures, but may likewise differ from one another in terms of the dimensioning of their circuit components.

In the case of the example embodiments shown, the control signal is produced on the basis of an output signal from the replica amplifier stage. This can be accomplished particularly by comparing the output signal from the replica amplifier stage with a further reference signal. Specifically, the control signal can be used to regulate a gain of the replica amplifier stage on the basis of a discrepancy between the output signal from the replica amplifier stage and the further reference signal. The gain of the replica amplifier stage would therefore typically be regulated such that it corresponds to the ratio between the reference signal supplied to the replica amplifier stage and the further reference signal. In this way, it is possible to compensate for discrepancies in the gain on account of temperature, supply voltage or process variations, for example. Since the control signal is additionally used to adjust the gain of one or more of the cascaded amplifier stages, corresponding compensation can also be obtained for the cascaded amplifier stages.

The compensation for influences by process variations, temperature variations or supply voltage variations allows a decrease in production rejects and/or observance of more stringent circuit specifications. This is particularly advantageous for implementations of the amplifier stages that are based on transconductance amplifier circuits and load resistors. Since the latter do not need to be operated in the range of strong inversion, it therefore also becomes easier to achieve low power draw for the amplifier.

Figure 1:
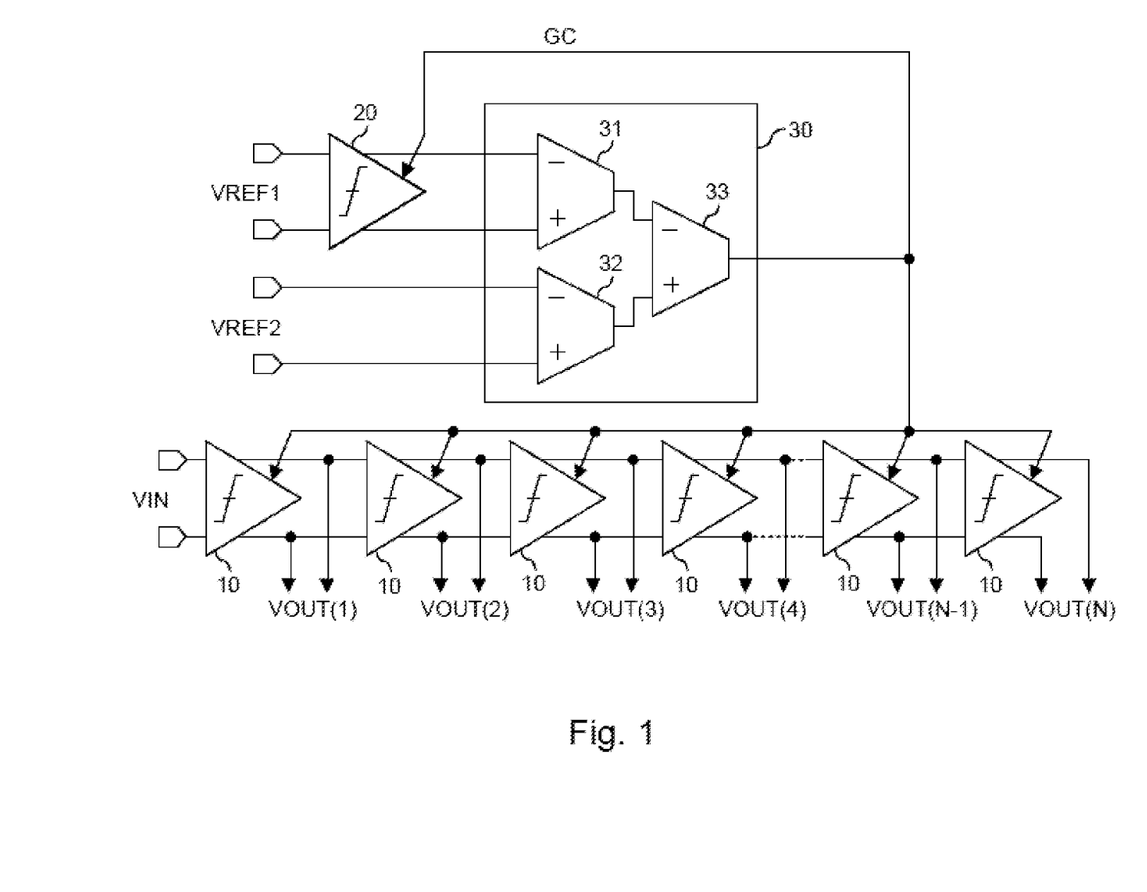
FIG. 1 schematically illustrates a limiting amplifier according to an example embodiment of the disclosure.

FIG. 1 schematically illustrates a circuit design for a limiting amplifier according to an example embodiment. By way of example, the circuit structures shown in FIG. 1 may be implemented by CMOS technology on a single semiconductor chip.

As shown, the amplifier has a plurality of cascaded amplifier stages 10. The cascaded amplifier stages 10 amplify an input signal VIN for the amplifier. In the case of the example embodiment shown, a corresponding amplified output signal VOUT(1), VOUT(2), VOUT(3), VOUT(4), . . . , VOUT(N−1), VOUT(N) can be tapped off at an output of each of the cascaded amplifier stages 10. In the case of differing implementations, it would also be possible for just the amplified output signal VOUT(N) from the last amplifier stage 10 of the cascaded arrangement to be able to be tapped off, for example.

In the case of the cascaded amplifier stages 10, the respectively provided gain can be adjusted using a control signal GC. In order to produce the control signal GC, a replica amplifier stage 20 and a control circuit 30 are provided. The replica amplifier stage 20 is supplied not with the input signal VIN for the amplifier, but rather with a reference signal VREF1. The reference signal VREF1 can be produced internally in the amplifier or can be provided by means of an external reference signal source. In the case of the example embodiment shown, the control circuit 30 is furthermore supplied with a further reference signal VREF2, which can likewise be produced internally in the amplifier or can be provided by means of an external reference signal source. The control circuit 30 produces the control signal GC on the basis of a comparison between an output signal from the replica amplifier stage 20 and the further reference signal VREF2. Specifically, the control circuit comprises amplifier elements 31, 32, 33 that implement an error amplifier that determines a discrepancy between the output signal from the replica amplifier stage 20 and the further reference signal VREF2 and takes said discrepancy as a basis for regulating the gain of the replica amplifier stage using the control signal GC. In the steady state, the gain of the replica amplifier stage 20 would therefore correspond to the ratio of the further reference signal VREF2 to the reference signal VREF1.

In the case of the implementation shown, the limiting amplifier is implemented in differential fashion. Hence, the input signal VIN is supplied as a differential signal. Equally, the reference signal VREF1 and the further reference signal VREF2 are also available as differential signals. The amplifier element 31 of the control circuit 30 is used to convert the differential output signal from the replica amplifier stage into a single-pole signal. Correspondingly, the amplifier element 32 of the control circuit 30 is used to convert the differential further reference signal VREF2 into a single-pole signal. The amplifier element 33 of the control circuit 30 is used to form a difference between the output signal from the amplifier element 32 and the output signal from the amplifier element 31, i.e. ultimately to form a difference between the output signal from the replica amplifier stage 20 and the further reference signal VREF2.

Figure 2A:
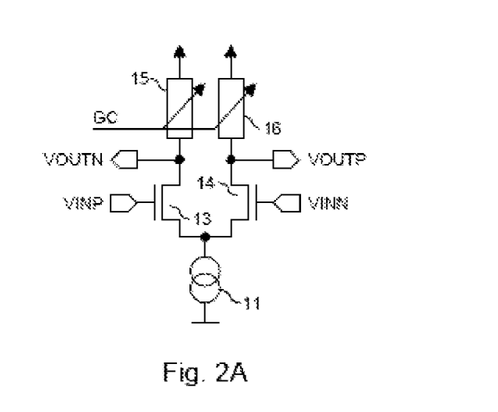
FIGS. 2A and 2B illustrate example circuit structures for amplifier stages that can be used in the amplifier.
Figure 2B:
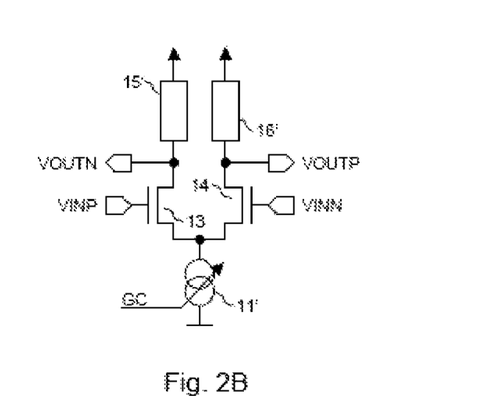

FIGS. 2A and 2B show example circuit structures that can be used in the cascaded amplifier stages 10, wherein it goes without saying that corresponding circuit structures are then also provided in the replica amplifier stage 20.

In the case of the example of FIG. 2A, the amplifier stage has a transconductance amplifier circuit having a bias current source 11 and transistors 13, 14. A gate connection of the transistor 13 is supplied with a first signal element VINP of the differential input signal for the amplifier stage, and a gate connection of the transistor 14 is supplied with a second signal element VINN of the differential input signal for the amplifier stage. This input signal VINP, VINN is taken as the basis for controlling the current flowing through the transistors 13, 14, which in turn flows through load resistors 15, 16, at which a differential output signal from the amplifier stage can be tapped off in the form of a first signal element VOUTN and a second signal element VOUTP. The gain of the amplifier stage shown in FIG. 2A is determined by the transconductases of the transistors 13, 14 and by the resistance values of the load resistors 15, 16. The resistance values of the load resistors 15, 16 and hence also the gain of the amplifier stage can be adjusted using the control signal GC.

In the case of the example in FIG. 2B, the circuit structure of the amplifier stage fundamentally corresponds to that of FIG. 2A, but instead of the adjustable resistors 15, 16 there are fixed resistors 15', 16' provided and instead of the bias current source 11 there is a bias current source 11' provided, which provides a bias current that can be adjusted using the control signal GC. In this case, use is made of the fact that during operation in weak inversion the transconductance of the transistors 13, 14 is also dependent on the value of the bias current flowing through them, which in turn allows the gain to be adjusted using the bias current source.

Naturally, differing implementations of the amplifier stage are possible. By way of example, it would also be possible for there to be provision for the gain to be adjusted using both the resistance value of the load resistors 15, 16 and using the bias current provided by the bias current source 11'.

Figure 3:
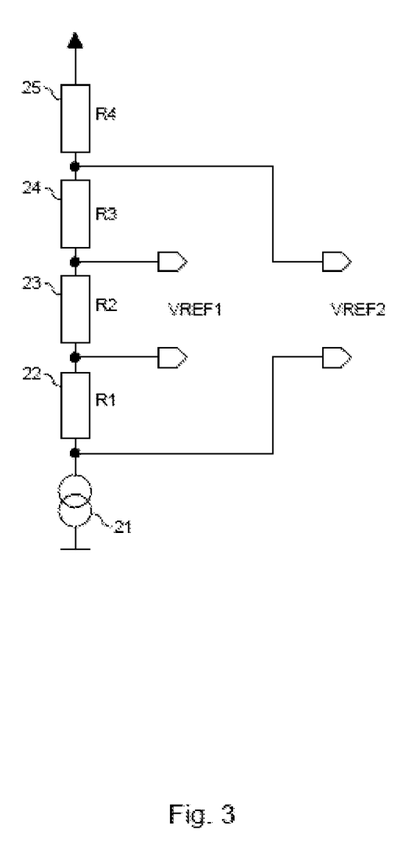
FIG. 3 illustrates a circuit for producing reference signals used according to an example embodiment.

FIG. 3 shows an example circuit that can be used to produce the reference signals VREF1, VREF2 used for the limiting amplifier of FIG. 1. By way of example, the circuit in FIG. 3 may be integrated in the limiting amplifier, e.g. realized with the amplifier on the same chip. Alternatively, the circuit may also be provided as an external component.

In the case of the example implementation shown in FIG. 3, the reference signals are produced as reference voltages using a differential resistor-based voltage divider. In this case, the reference signal VREF1 and the further reference signal VREF2 are produced particularly as reference voltages that have a firmly prescribed ratio to one another. This ratio is determined by resistors 22, 23, 24, 25 provided in the voltage divider.

As can be seen in FIG. 3, the circuit for producing the reference signals VREF1 and VREF2 has, in particular, a current source 21 and the series-coupled resistors 22, 23, 24, 25 of the voltage divider. In the case of the implementation shown, the reference signal VREF1 can be tapped off as a voltage across the resistor 23, and the further reference signal VREF2 can be tapped off as a voltage across the resistors 22, 23, 24. In order to ensure symmetrical production of the voltages corresponding to the reference signals VREF1, VREF2, identical resistance values can be chosen for the resistor 23 and the resistor 24. The ratio of the reference voltages produced by the circuit is provided by VREF1/VREF2=R2/(R1+R2+R3), where R1 denotes the resistance value of the resistor 22, R2 denotes the resistance value of the resistor 23 and R3 denotes the resistance value of the resistor 24. Consequently, the ratio of the reference signals VREF1, VREF2 is independent of the current produced by the current source 21 and also independent of a supply voltage used in the circuit. In addition, it can also be assumed that the ratio of the reference signals VREF1, VREF2 is not substantially influenced by temperature or process variations, since these would similarly affect the resistance values of the resistors 22, 23, 24 and the ratio formation.

In the case of some implementations, it is desirable for the reference signal VREF1 supplied to the replica amplifier stage 20 to be chosen to be sufficiently small for operation of the replica amplifier stage in the linear range to be ensured. By way of example, the reference signal VREF1 could be produced as a voltage in the region of a few mV. Values of the reference signal VREF1 in such a low voltage range can sometimes lie in the region of typical offset voltages of operation amplifiers implemented in CMOS technology, however, as may be used in the amplifier elements 31, 32, 33 of the control circuit 30. This can result in erroneous regulation of the gain of the replica amplifier stage 20 being effected on the basis of the offset voltage, with corresponding effects on the adjustment of the gains of the cascaded amplifier stages 20.

In the case of some implementations, it is possible to take account of this circumstance by virtue of the amplifier furthermore being provided with a switch arrangement that prompts a cyclic change of arithmetic sign of the reference signal VREF1 and of the further reference signal VREF2, so that the offset voltages of the amplifier elements 31, 32, 33 contribute to the control signal GC alternately using respectively different arithmetic signs and there is compensation, on average over time, for the influence of the offset voltages on the control signal GC. An example implementation of such a technique, also referred to as "chopping", is illustrated in FIG. 4.

Figure 4:
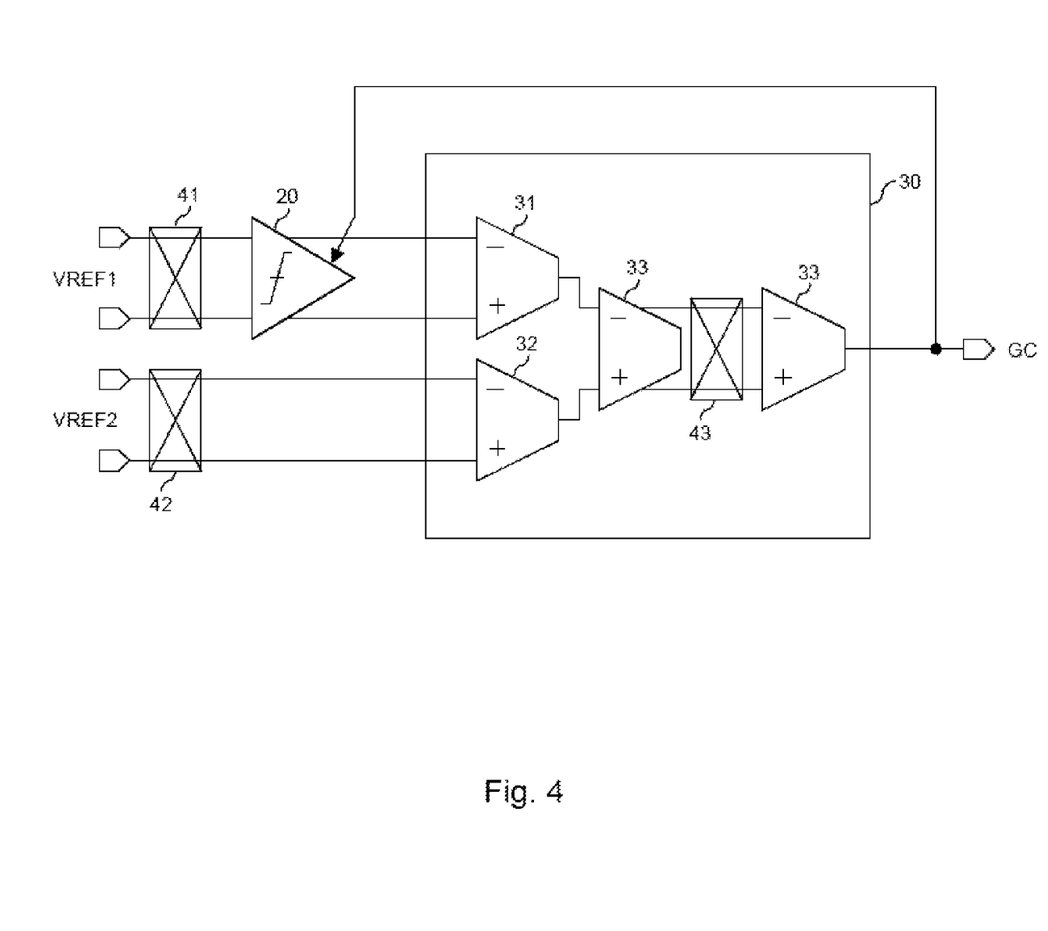
FIG. 4 illustrates a circuit that is used in an example embodiment of the disclosure to produce a control signal.

As FIG. 4 shows, the switch arrangement for implementing the chopping technique has a plurality of switching nodes 41, 42, 43. The switching node 41 prompts a cyclic change in the polarity of the reference signal VREF1 supplied to the replica amplifier stage 20. The switching node 42 prompts a cyclic change in the polarity of the further reference signal VREF2 supplied to the control circuit 30. The switching node 43 prompts a cyclic change in the polarity of a differential intermediate signal that is produced by a differential amplifier element 33' connected upstream of the amplifier element 33. The switching node 43 ensures that the change in the polarity of the reference signal VREF1 and of the further reference signal VREF2 has no effect on the arithmetic sign of the difference produced in the amplifier element 33.

In the case of the chopping technique shown in FIG. 4, it goes without saying that the switching nodes 41, 42, 43 change the polarities in sync with one another. Hence, when the switching node 41 supplies the reference signal VREF1 to the replica amplifier stage 20 using a first polarity, the switching node 42 supplies the further reference signal VREF2 to the control circuit 30 likewise using the first polarity. When, by contrast, the switching node 41 supplies the reference signal VREF1 to the replica amplifier stage 20 using a second polarity, which is opposite to the first polarity, the switching node 42 supplies the further reference signal VREF2 to the control circuit 30 likewise using the second polarity. Equally, the switching node 43 supplies the amplifier element 33 with its input signal using the first polarity when the switching nodes 41, 42 use the first polarity, and supplies the amplifier element 33 with its input signal using the second polarity when the switching nodes 41, 42 use the second polarity.

The chopping technique illustrated on the basis of the implementation of FIG. 4 can therefore reduce the influence of offset voltages in the control circuit 30 and sometimes even compensate therefor substantially completely, as a result of which it is possible to achieve improved observance of the gains desired for the cascaded amplifier stages 10 and hence more precise observance of the desired limiting amplifier characteristic.

Figure 5:
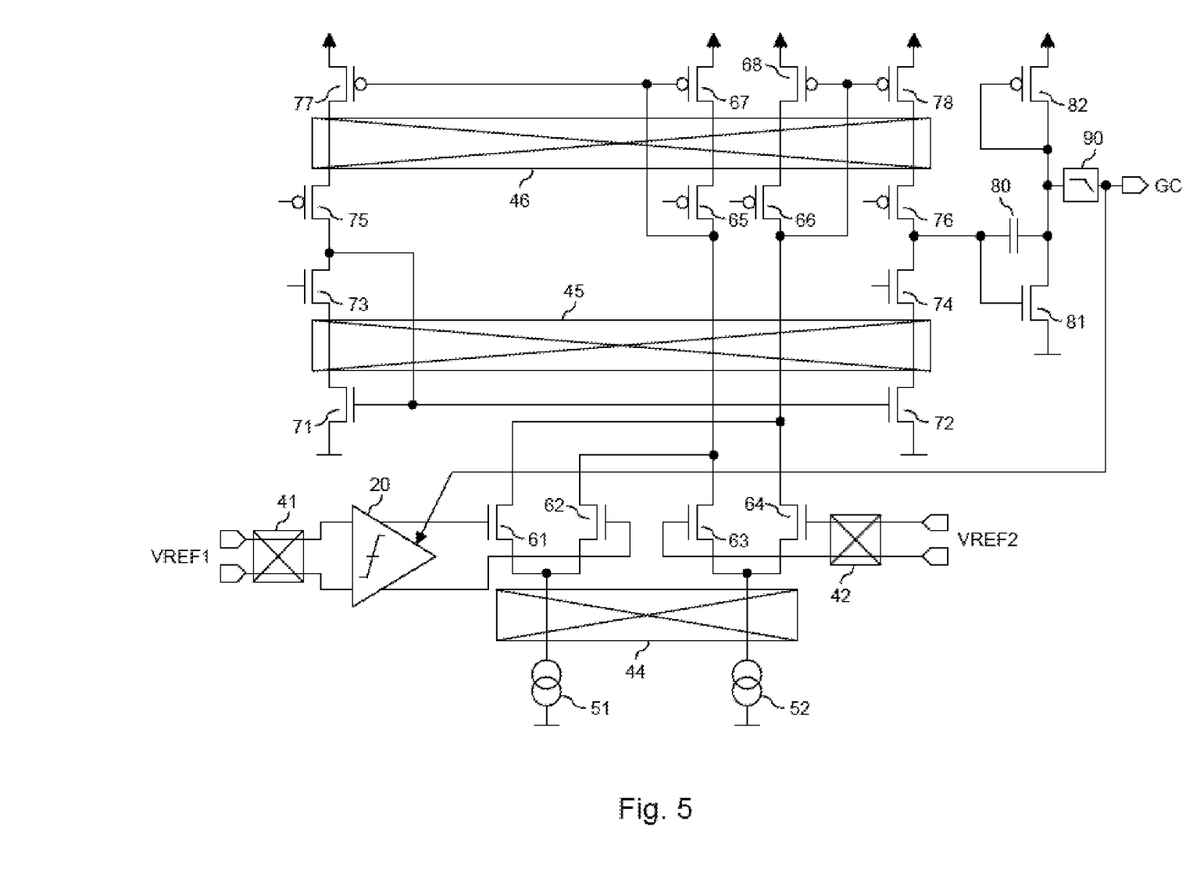
FIG. 5 illustrates further details of an implementation of a circuit that can be used in an example embodiment of the disclosure to produce a control signal.

An example circuit implementation for realizing the gain regulation for the replica amplifier stage 20 in combination with the chopping technique illustrated with reference to FIG. 4 is illustrated in FIG. 5.

In the case of the circuit implementation illustrated in FIG. 5, the control circuit is realized in CMOS technology by three amplifier elements that each have NMOS transistors (NMOS: n-channel MOS) and PMOS transistors (PMOS: p-channel MOS). The amplifier stages are powered by means of bias current sources 51, 52.

A first amplifier element, formed by NMOS transistors 61, 62, 63, 64 and PMOS transistors 65, 66, 67, 68, picks up the output signal from the replica amplifier stage 20 and also the further reference signal VREF2 and produces a differential difference signal. Said differential difference signal is supplied to a second amplifier element, formed by NMOS transistors 71, 72, 73, 74 and PMOS transistors 75, 76, 77, 78, which produces a single-pole difference signal therefrom. Said signal is in turn supplied to a third amplifier element, formed from a capacitance 80, an NMOS transistor 81 and a PMOS transistor 82, which third amplifier element serves as a signal integrator. Finally, in the case of the circuit implementation shown in FIG. 5, the output of the third amplifier element is also provided with a low-pass filter 90 that is used to produce the control signal GC used to regulate the gain of the replica amplifier stage 20 from the output signal from the third amplifier element.

The switching nodes 41, 42 already explained with reference to FIG. 4 are provided at signal inputs that are used to supply the reference signal VREF1 and the further reference signal VREF2.

In addition, switching nodes 44, 45, 46 are provided that implement the functions of the switching node 43 explained with reference to FIG. 4. For this purpose, a cyclic change between the polarities of the forwarded differential signals takes place both between the bias current sources 51, 52 and within the second amplifier element via the switching nodes 44, 45, 46.

Figure 6:
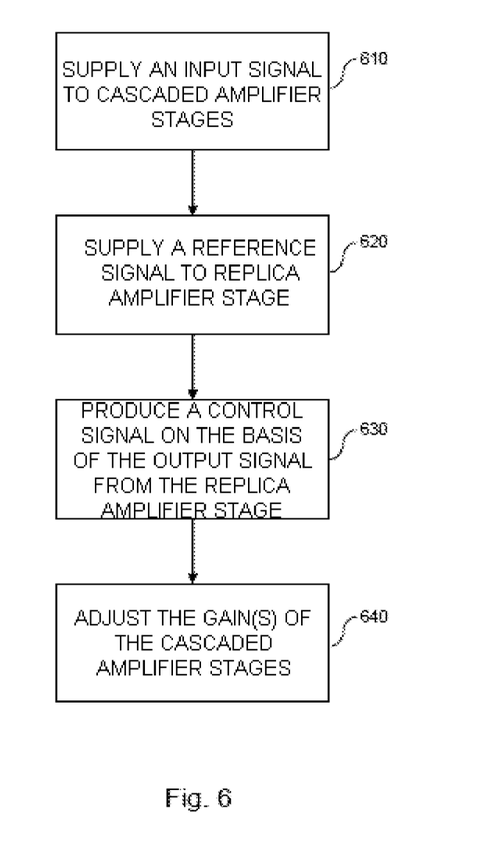
FIG. 6 shows a flowchart to illustrate a method according to an example embodiment of the disclosure.

FIG. 6 shows a flowchart that illustrates a method for operating a limiting amplifier according to an example embodiment. The method is used particularly for controlling the operation of a limiting amplifier that has a multiplicity of cascaded amplifier stages for amplifying an input signal for the amplifier. By way of example, the method can be implemented using circuits as have been explained in connection with FIGS. 1 to 5.

At 610, an input signal for the amplifier is supplied to a multiplicity of cascaded amplifier stages of the amplifier. By way of example, the cascaded amplifier stages may be based on a transconductance amplifier circuit and a load resistor, as illustrated in FIG. 2A or 2B, for example. The cascaded amplifier stages are used to amplify the input signal for the amplifier so as to produce an amplified output signal from the amplifier. The cascaded amplifier stages may be implemented by identical circuit structures but may differ from one another in terms of the dimensioning of their circuit components.

At 620, a reference signal is supplied to a further amplifier stage, which is modeled on one of the cascaded amplifier stages. An example of such a further amplifier stage is the replica amplifier stage 20 explained above.

At 630, an output signal from the further amplifier stage is taken as a basis for producing a control signal. By way of example, the control signal can be produced on the basis of a comparison of the output signal from the further amplifier stage with a further reference signal. In the case of some implementations, the reference signal and the further reference signal are produced as reference voltages with a prescribed ratio using a voltage divider, e.g. by means of a circuit as illustrated in FIG. 3. The voltage divider may be implemented as part of the amplifier or provided as an external component.

In the case of some implementations, the production of the control signal may involve a gain of the further amplifier stage being regulated on the basis of a discrepancy between the output signal from the further amplifier stage and the further reference signal.

At 640, a gain of at least one of the cascaded amplifier stages is adjusted using the control signal. In the case of some implementations, the respective gain for a plurality or even all of the cascaded amplifier stages can be adjusted using the control signal.

If the cascaded amplifier stages have a transconductance amplifier circuit and at least one load resistor, the gain can be adjusted by using the control signal to adjust a resistance value of the at least one load resistor, as explained in connection with FIG. 2A, for example. In addition or alternatively, the gain can be adjusted by using the control signal to adjust a bias current source of the transconductance amplifier circuit, particularly a current produced by the transconductance amplifier circuit, as explained in connection with FIG. 2B, for example.

In the case of some implementations, the reference signal and the further reference signal may be differential. This is advantageous when the cascaded amplifier stages and hence also the further amplifier stages are implemented as differential amplifier stages, for example. In such a case, provision may additionally be made for cyclic changeover to take place between a first state, in which the reference signal is supplied to the further amplifier stage and the further reference signal is supplied using a first polarity, and a second state, in which the reference signal and the further reference signal are supplied using a second polarity, which is opposite to the first polarity. By way of example, such an approach can allow compensation for offset voltages in amplifier elements that are used for the comparison of the output signal from the further amplifier stage with the further reference signal, as has been described in connection with the chopping technique explained with reference to FIG. 4, for example.

The designs described in reference to the above example embodiments can therefore be used to allow efficient implementation of a limiting amplifier. In particular, well-defined gains for the individual cascaded amplifier stages can be set efficiently, so that a desired limiting amplifier characteristic is obtained. The use of the further amplifier stage, which is modeled on one of the cascaded amplifier stages, particularly allows the gains of the cascaded amplifier stages to be adjusted and thus variations in temperature, process conditions or in the supply voltage to be compensated for, for example, without this requiring sensing of the gain on the cascaded amplifier circuits themselves.

It goes without saying that many and diverse modifications are possible for the example embodiments shown without departing from the basic concept of the designs shown. By way of example, the amplifier can be provided with a plurality of replica amplifier stages so as to be able to take account of differing circuit structures of individual cascaded amplifier stages more precisely, for example. In addition, the adjustment of the gain that is shown could be effected just for a selection of one or more of the cascaded amplifier stages. Furthermore, it goes without saying that a limiting amplifier realizing the designs shown can be used in many and diverse areas of application but they can differ from the example areas of application mentioned above.

The invention claimed is:

1. A limiting amplifier, comprising:
   a multiplicity of cascaded amplifier stages for amplifying an input signal for the amplifier;
   a further amplifier stage, which is modeled on one of the cascaded amplifier stages and to which a reference signal is supplied; and
   a control circuit that is configured to take an output signal from the further amplifier stage as a basis for producing a control signal for adjusting a gain of at least one of the cascaded amplifier stages,
   wherein the cascaded amplifier stages and the further amplifier stage each comprise a transconductance amplifier circuit and at least one load resistor, and
   wherein the control signal is used to adjust a resistance value of the at least one load resistor.

2. The amplifier as claimed in claim 1, wherein the cascaded amplifier stages and the further amplifier stage are implemented by identical circuit structures.

3. The amplifier as claimed in claim 1, wherein at least two of the cascaded amplifier stages differ from one another in terms of a dimensioning of their circuit components.

4. The amplifier as claimed in claim 1, wherein the control signal is used to adjust a bias current source of the transconductance amplifier circuit.

5. The amplifier as claimed in claim 1, wherein the control circuit is configured to compare the output signal from the further amplifier stage with a further reference signal.

6. The amplifier as claimed in claim 1, wherein the control circuit comprises an error amplifier that is configured to regulate the gain of the further amplifier stage via the control signal on the basis of a discrepancy between the output signal from the further amplifier stage and the further reference signal.

7. The amplifier as claimed in claim 5, further comprising:
a voltage divider configured to produce the reference signal and the further reference signal as reference voltages with a prescribed ratio therebetween.

8. A limiting amplifier, comprising:
a multiplicity of cascaded amplifier stages for amplifying an input signal for the amplifier;
a further amplifier stage, which is modeled on one of the cascaded amplifier stages and to which a reference signal is supplied; and
a control circuit that is configured to take an output signal from the further amplifier stage as a basis for producing a control signal for adjusting a gain of at least one of the cascaded amplifier stages,
wherein the control circuit is configured to compare the output signal from the further amplifier stage with a further reference signal, and
wherein the reference signal and the further reference signal are differential.

9. The amplifier as claimed in claim 8, further comprising:
a switch arrangement configured to change cyclically between:
a first state, in which the reference signal is supplied to the further amplifier stage and the further reference signal is applied to the control circuit using a first polarity, and
a second state, in which the reference signal is supplied to the further amplifier stage and the further reference signal is supplied to the control circuit using a second polarity, which is opposite to the first polarity.

10. A method comprising:
supplying an input signal to a multiplicity of cascaded amplifier stages of a limiting amplifier;
supplying a reference signal to a further amplifier stage, which is modeled on one of the cascaded amplifier stages;
producing a control signal on the basis of an output signal from the further amplifier stage; and
adjusting a gain of at least one of the cascaded amplifier stages via the control signal,
wherein the control signal is produced on the basis of a comparison of the output signal from the further amplifier stage with a further reference signal, and
wherein the reference signal and the further reference signal are differential.

11. The method as claimed in claim 10,
wherein the cascaded amplifier stages and the further amplifier stage are implemented by identical circuit structures.

12. The method as claimed in claim 10,
wherein at least two of the cascaded amplifier stages differ from one another in terms of the dimensioning of their circuit components.

13. A method comprising:
supplying an input signal to a multiplicity of cascaded amplifier stages of a limiting amplifier;
supplying a reference signal to a further amplifier stage, which is modeled on one of the cascaded amplifier stages;
producing a control signal on the basis of an output signal from the further amplifier stage; and
adjusting a gain of at least one of the cascaded amplifier stages via the control signal,
wherein the cascaded amplifier stages and the further amplifier stage each comprise a transconductance amplifier circuit and at least one load resistor, and
wherein the control signal is used to adjust a resistance value of the at least one load resistor.

14. The method as claimed in claim 10,
wherein the control signal is used to regulate a gain of the further amplifier stage on the basis of a discrepancy between the output signal from the further amplifier stage and the further reference signal.

15. The method as claimed in claim 10, wherein a voltage divider is used to produce the reference signal and the further reference signal as reference voltages with a prescribed ratio therebetween.

16. The method as claimed in claim 10, further comprising:
performing a cyclic changeover between:
a first state, in which the reference signal and the further reference signal are supplied using a first polarity, and
a second state, in which the reference signal and the further reference signal are supplied using a second polarity, which is opposite to the first polarity.

* * * * *